(12) United States Patent
Rotaru et al.

(10) Patent No.: US 7,348,680 B2
(45) Date of Patent: Mar. 25, 2008

(54) ELECTRONIC DEVICE AND USE THEREOF

(75) Inventors: Mihai Dragos Rotaru, Singapore (SG); Johannus Wilhelmus Weekamp, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 137 days.

(21) Appl. No.: 10/540,182

(22) PCT Filed: Dec. 22, 2003

(86) PCT No.: PCT/IB03/06109

§ 371 (c)(1),
(2), (4) Date: Jun. 20, 2005

(87) PCT Pub. No.: WO2004/057673

PCT Pub. Date: Jul. 8, 2004

(65) Prior Publication Data

US 2006/0202337 A1 Sep. 14, 2006

(30) Foreign Application Priority Data

Dec. 23, 2002 (EP) ................... 02080670

(51) Int. Cl.
*H01L 23/48* (2006.01)
*H01L 23/52* (2006.01)

(52) U.S. Cl. .............. 257/786; 257/728; 257/734; 257/773; 257/776; 257/E23.02

(58) Field of Classification Search ............. 247/772, 247/779; 257/664, 665, 672, 730, 734–786, 257/727, 728, E29.111, E29.165, E23.01, 257/E23.079, 678, 690, 602–604, 691, 693, 257/735, 773–778, 780–786, E23.015, E23.02, 257/E23.021

See application file for complete search history.

(56) References Cited

U.S. PATENT DOCUMENTS

| | | | | |
|---|---|---|---|---|
| 4,034,399 A | * | 7/1977 | Drukier et al. ............. | 257/275 |
| 4,979,003 A | * | 12/1990 | Wennekers ................. | 257/192 |
| 4,987,562 A | * | 1/1991 | Watanabe ................... | 257/742 |
| 5,406,120 A | * | 4/1995 | Jones ......................... | 257/706 |
| 6,166,436 A | | 12/2000 | Maeda et al. | |
| 6,232,563 B1 | * | 5/2001 | Kim et al. .................. | 174/261 |
| 6,271,579 B1 | | 8/2001 | Going et al. | |
| 6,683,380 B2 | * | 1/2004 | Efland et al. ............... | 257/734 |
| 6,706,967 B2 | * | 3/2004 | Hayasi ....................... | 174/539 |

FOREIGN PATENT DOCUMENTS

| | | | | |
|---|---|---|---|---|
| EP | 0818824 A2 | 1/1998 | | |
| JP | 56162858 | 12/1981 | | |
| JP | 30205853 | * 9/1991 | ................. | 257/786 |
| JP | 6-84915 | * 3/1994 | ................. | 257/786 |
| JP | 09213838 A | 8/1997 | | |
| WO | 200201631 A2 | 1/2002 | | |
| WO | 2002001631 A3 | 1/2002 | | |
| WO | 2002103792 A2 | 12/2002 | | |

* cited by examiner

*Primary Examiner*—Jasmine Clark
(74) *Attorney, Agent, or Firm*—Paul Im

(57) ABSTRACT

The electronic device (100) comprises a semiconductor element (1) (e.g. a transistor), an encapsulation (5) and an electrically conductive layer (3) with a first and a second contact pad (11,12), used as signal pads, and a third contact pad (13) used as ground pads. Due to the shape of the contact pads (11,12,13), the spacing (200) is continuous, with a small entrance in between of the first and second contact pads (11,12). Consequently, the parasitic inductance is reduced and the device (100) is suitable for use at frequencies below and above 30 GHz, particularly up to 40 GHz.

10 Claims, 3 Drawing Sheets

ELECTRONIC DEVICE AND USE THEREOF

The invention relates to an electronic device comprising at least one semiconductor element having a first and an opposed, second side, which at least one semiconductor element is provided with a first, a second and a third bonding pad and is encapsulated with a passivating material, which device further comprises an electrically conductive layer at the first side, which layer comprises a first, a second and a third contact pad suitable for external contacting, and which first, second and third contact pads are connected to the first, second and third bonding pads respectively through electrically conductive interconnecting means, which first and second contact pads are provided with a first and a second side face and which third contact pad is provided with a first side face, which first side faces of the first and second contact pads are facing the first side face of the third contact pad, which second side faces of the first and second contact pads are facing each other at least partially and comprise a first part and a second part, the first part located nearer to the first side face than the second part.

The invention also relates to use of this electronic device.

Such an electronic device is described in the non-prepublished application IB02/02305 (PHNL010398). Said device is provided with a first and a second conductive layer, in between of which a semiconductor element and a connection member are present. The semiconductor element and the connection member are contacted to the first conductive, patterned layer with metal bumps. At the second side they are connected with electrically conductive adhesive to the second conductive layer. The first conductive layer is provided with five contact pads, of which the third is connected to the connection member and the others are connected to the semiconductor element. The third contact pad is provided with an extension at its first side. This extension is present between the first and second contact pad, such that the first parts of the second side faces are facing the side faces of the extension.

It is a disadvantage of the described device, that at frequencies higher than 30 GHz, the insertion loss falls under −0.5 dB. This will cause signal distortion, resulting therein that the device is not suitable for millimeter wave applications.

It is therefore an object of the present invention to provide an improved device of the kind described in the opening paragraph, which is also suitable for frequencies higher than 30 GHz.

This object is achieved in that:
  the first side faces of the first and second contact pads and the first side face of the third contact pad are separated by a spacing that is continuous along the first side faces, and
  the first parts of the second side faces of the first and second contact pads are at a mutual distance that is smaller than the distance between the second parts of these side faces.

The resulting device also functions adequately at frequencies higher than 30 GHz. High reflection above 30 GHz is mainly due to the shape of the wave-guide and the material properties. The invention provides an improved shape with less reflection. As a result influences the insertion loss behavior is improved.

It is an advantage of the device of the invention, that the parasitic inductance is considerably reduced as compared to the described device. This is not only the case at frequencies above 30 GHz, but also at lower frequencies.

In a preferred embodiment the first and the second part of the second side faces are oriented substantially parallel to each other and are separated through a third parallel. Good results have been obtained with this structure, particularly in fact thereof that the parasitic capacity between the first and second contact pad is considerably reduced.

In another embodiment the first and second side faces of the first and the second contact pads enclose an angle which is in between of 90 and 180 degrees. It is understood that the first side faces is not completely straight. The angle is measured as between a major part of the first side face and the first part of the second side face. Due to this angle the spacing between the first sides of the contact pads has less sharp turns than that of the described device—which sharp turns cause the reflection—and has longer straight portions where the flow of the wave is unimpeded.

Particularly, the spacing has a trapezium shape. Such a shape improves the transmission of the wave, inside of the wave guide.

Alternatively, the spacing has a straight shape. This appears the ideal format, since the power wave flows unimpeded and as a result the insertion loss is the smallest.

In a preferred embodiment the third contact pad is connected to ground. The problem of insertion loss is particularly present in this case, since the electromagnetic waves are influenced by potential differences. However, instead of a ground potential, the third contact pad may also be provided with a negative potential or another potential, that is different from the potentials at the first and second contact pads. These contact pads are generally used as signal pads.

In a further embodiment:
  the third contact pad is provided with a second side face opposed to the first side face;
  a fourth and a fifth contact pad are present at the second side face of the third contact pads, which are connected to fourth and fifth bonding pads at the at least one semiconductor element; and
  the fourth and fifth contact pads are provided with a first and a second side face, which first side faces of the fourth and fifth contact pads are facing the second side face of the third contact pad and are separated by a spacing that is continuous, which second side faces are facing each other and comprise a first part and a second part, the first part located nearer to the first side face than the second part, which first parts of the second side faces are at a mutual distance that is smaller than the distance between the second parts of these side faces.

In this embodiment the device may comprise more than one semiconductor element, or may be semi-discrete element. The fourth and fifth contact pads have a pattern which is substantially the same as that of the first and second contact pads.

In a further embodiment the third contact pad is connected with a second conductive layer, which is present at the second side of the semiconductor element. The third contact pad is in this manner provided to a back-contact of the semiconductor element. The provision of the second conductive layer allows higher flexibility. The second conductive layer may be a heatsink and/or a ground plane, or a connection to the back-contact to vertical semiconductor elements, such as diodes and bipolar transistors.

The device of the invention is particularly, but certainly not exclusively a transistor.

Preferably, the electrically conductive layer of the device comprises both the contact pads for external contacting and pads for internal interconnecting. However, instead of such one-layer leadframe a two- or three layered construction may be used alternatively. It is highly preferred that the electrically conductive layer is mechanically anchored in the encapsulation. This is achieved, for instance, in that the electrically conductive layer is provided on a sacrificial layer, which is etched so as to create under-etch under the electrically conductive layer. One of the advantages of this construction, next to its improved mechanical stability, is that the electrically conductive layer may have a relative small thickness, particularly smaller than 40 micrometers, and preferably in the range of 5-15 micrometers. A very suitable material is copper that is provided with suitable adhesion layers for any metal or solder bumps. The interconnecting means comprises metal bumps by preference; however, wire bonds may be used alternatively.

In a suitable embodiment, the semiconductor element is chosen to have a substrate material other than Si, such as SiC, SiGe or a III-V material. Good results have been obtained with a SiGe transistor. With such a transistor in the package of the invention, a cut-off frequency ($F_t$) of about 45 GHz has been obtained, using a biasing conditions $V_{ce}$=0 to 2 V in steps of 200 mV, $I_b$=0 to 300 µA in steps of 30 µA. This value is higher than that of commercially available transistors packaged in both leaded and leadless packages.

These and other aspects of the device of the invention and its use will be further elucidated with reference to the FIGS. and a table, in which.

The Figs. are not drawn to scale and are purely diagrammatical. Like reference number in different Figs. refer to like parts.

Figure 1:
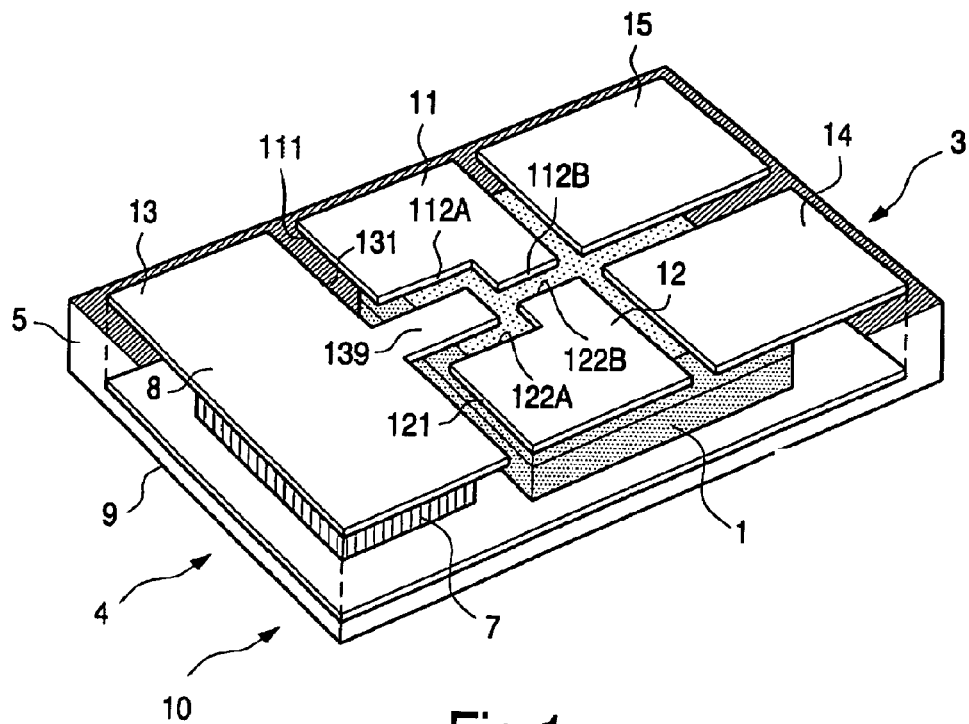
FIG. 1 shows in bird-eye perspective the device as described in the earlier application.

FIG. 1 shows a prior device 10 with a first side 8 and a second side 9. It comprises a first electrically conductive layer 3 and a second electrically conductive layer 4, both comprising copper and having a thickness of 50-100 micrometers. The device 10 is provided with a semiconductor element 1, and a connection member 7 of copper or silicon. Both are connected to the second conductive layer 4 with anisotropically conductive glue, and to the first conductive layer 3 with solder bumps. The elements 1,7 are encapsulated with an encapsulation 5 of passivating, electrically insulating material, in this case of epoxy, as known to the skilled person. The non-shown bonding pads (which may include the use of a face as contact, such as a back-contact), are connected to contact pads 11, 12, 13, 14, 15. The first and second contact pads 11,12 are provided with first side faces 111, 121 and second side faces 112, 122. These second side faces 112, 122 comprise a first part A and a second part B. Herein the first part is located nearer to the first side faces 111, 121. The third contact pad 13 comprises a first side faces 131 and is provided with an extension 139. The first parts 112A, 122A are facing to side faces of this extension 139. The packaging process of this prior device comprises a number of steps. First, the semiconductor element 1 is provided on the second conductive layer 4, and provided with bumps, in this case Au stud bumps. Use is made of an epoxy-type die attach material for the attachment of the element 1 to the second conductive layer 4 of Cu. Next, the first conductive layer 3 which is provided with a Sn finish layer is placed on the bumps. By applying heat and force, a Au—Sn interconnect layer is formed, resulting in an electrical connection between the element and the first conductive layer 3. This bonding process is done under shielding gas (Ar/H$_2$) at a temperature above the temperature for the formation of the Au—Sn intermetallic. A press with a thermode-like construction was used to apply the heat and the force. In order to obtain a more rigid structure, to enforce the Au—Sn bond areas, and to protect the later devices from environmental conditions, the gap between the first and second conductive layer 3,4 is filled with a liquid encapsulation material. Hereafter, the first conductive layer 3 is patterned using photolithography and etching. Alternatively, a foil comprising a first conductive layer 3 on top of a release layer can be used. Finally, in order to define the solderable areas of the package, a solder resist layer is patterned onto the products, followed by a finishing layer (electroless Ni/Au). For the solder resist layer, good results have been obtained with benzocyclobutene (BCB), which is cured at 260° C. for 60 minutes. As an alternative to the Au—Sn interconnection use can be made of an ultrasonic Au—Au bonding process. To allow the Au—Au interconnect the first conductive layer 3 is spot-plated with discrete Ni/Au dots. Bonding was performed with a KME flip chip bonder.

The package of the device serves the purposed of protecting the semiconductor element 1 against mechanical and chemical influences. It also creates a fan-out (pitch enlargement) of the connections between element 1 and printed board. This fan-out results in additional series inductances, particularly if use is made of bond wires. This effect may be reduced with low resistance, low inductance connections and leads in the package. This is present in the prior device. The device of the invention provides further improvements to the high-frequency behaviour.

Figure 2:
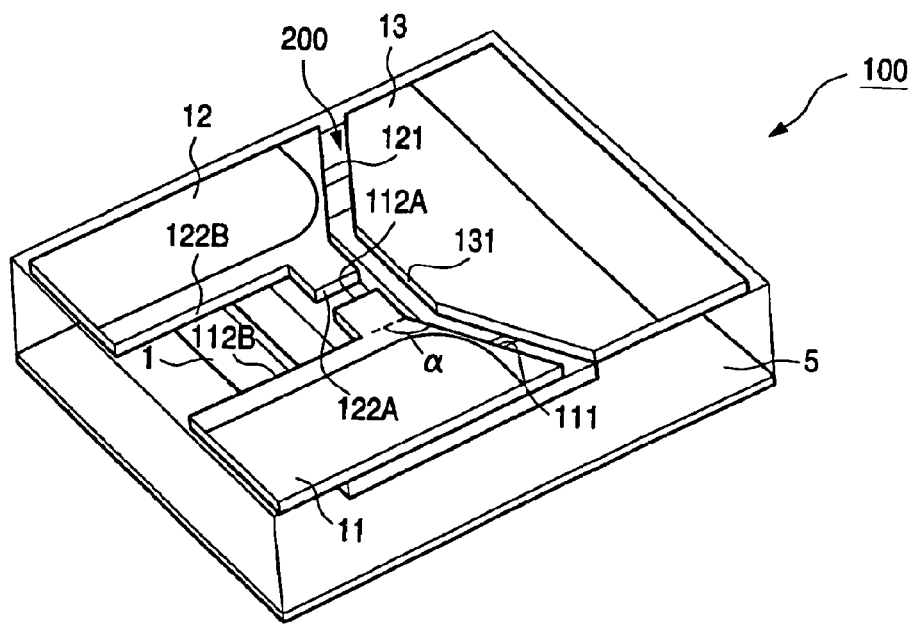
FIG. 2 shows in bird-eye perspective a first embodiment of the device of the invention.

FIG. 2 shows the device 100 of the invention in a first embodiment. The first and second contact pads 11,12 have second side faces 112, 122 with a first part 112A, 122A, and a second part 112B, 122B. These first parts 112A, 122A are at a mutual distance that is smaller than the mutual distance between the second parts 112B, 122B. One might say that the extensions on the first and second contact pads 11,12 have been transferred to a location nearer to the third contact pad 13.

Contrarily to the prior device, the device of the invention comprises between the first sides 111, 121, 131 a continuous spacing 200. The first and second contact pads 11,12 are used for the transmission of signals, whereas the third contact pad 13 is used as ground connection. It may be connected to a second conductive layer as the device in FIG. 1.

The structure of the invention, was realized in the first conductive layer 3 with a resolution of 60 µm spacing, with a margin of 2 µm (tests showed width between 59 and 62 µm). However, this resolution may be modified in alignment with device sizes and the specific application.

In this embodiment the major part of the first side faces 111, 121 and the first part 112A, 122A of the first and second contact pads 11, 12 enclose an angle α of more than 90 degrees, about 120 degrees in particular. This results in an improved transmission, and in a trapezium-like shape of the spacing 200.

Figure 3:
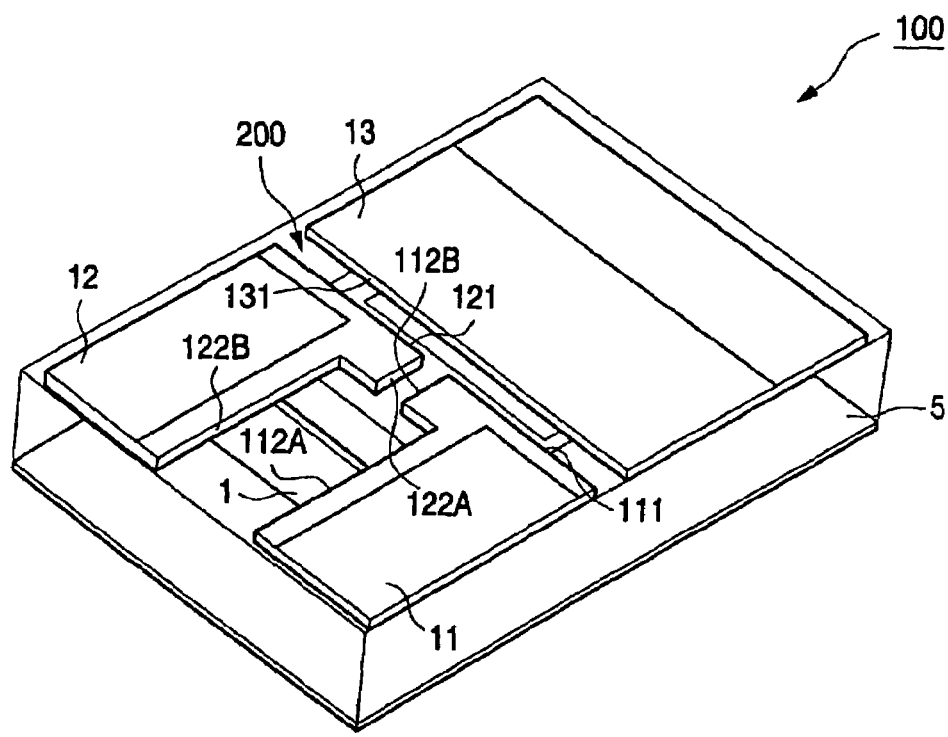
FIG. 3 shows in bird-eye perspective a second embodiment of this device.

FIG. 3 shows a second embodiment of the invention. Herein, the spacing 200 is straight, which has a positive influence on the insertion loss.

Figure 4:
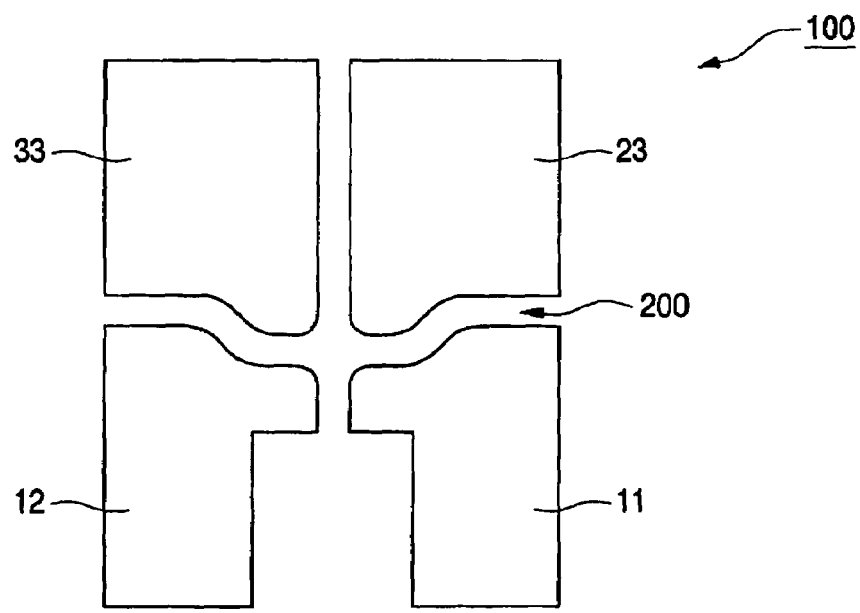
FIG. 4 shows a top view of a third embodiment of the device of the invention.

FIG. 4 shows a third embodiment of the device 100 of the invention. Herein, the spacing 200 comprises a curve. Besides, the third contact pad 13 is split into a first part 23 and a second part 33.

Figure 5:
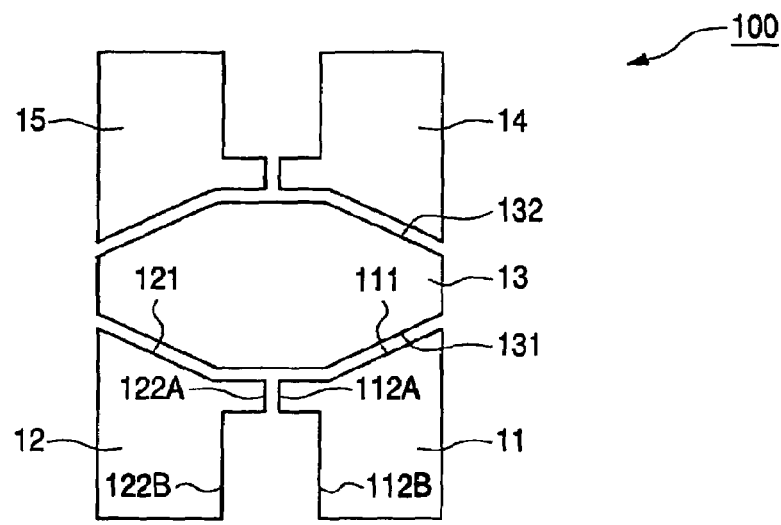
FIG. 5 shows a top view of a fourth embodiment of the device of the invention; Table 1 shows measurement data relating to the devices shown in FIG. 1-3.

FIG. 5 shows a fourth embodiment of the device 100 of the invention. Herein, a fourth contact pad 14 and a second contact pad 15 are present at the second side face 132 opposite to the first side face 131. The fourth and fifth contact pads 14, 15 have a shape similar as the first and the second contact pads 11,12. It is in this embodiment highly preferred that the third contact pad 13 is connected to the ground, and that the other contact pads 11,12,14,15 are signal pads.

Transistors of the types shown in-3 were compared. The transistor of the type (I) earlier described used herein did not contain any connection member and had only three contact pads, that were all connected to bonding pads at the first side of the transistor. The transistors of the invention (II, III) were those shown in FIGS. 2 and 3. The first and second contact pads were used as signal pads, whereas the third contact pad was used as ground pad.

Table 1 shows measurement data for the parasitic capacitance C and the inductance L of the transistors for different frequencies F. It can be seen that particularly the inductance L is considerably lower in the transistors of the invention. The capacitance C is somewhat higher in the type with a trapezium like spacing, but is very much comparable for the types I and III. Furthermore, in the transistors of the invention II, III, the change in the capacitance C and the inductance L as a function of the frequency F is smaller than in the transistor as earlier described I.

Figure 6:
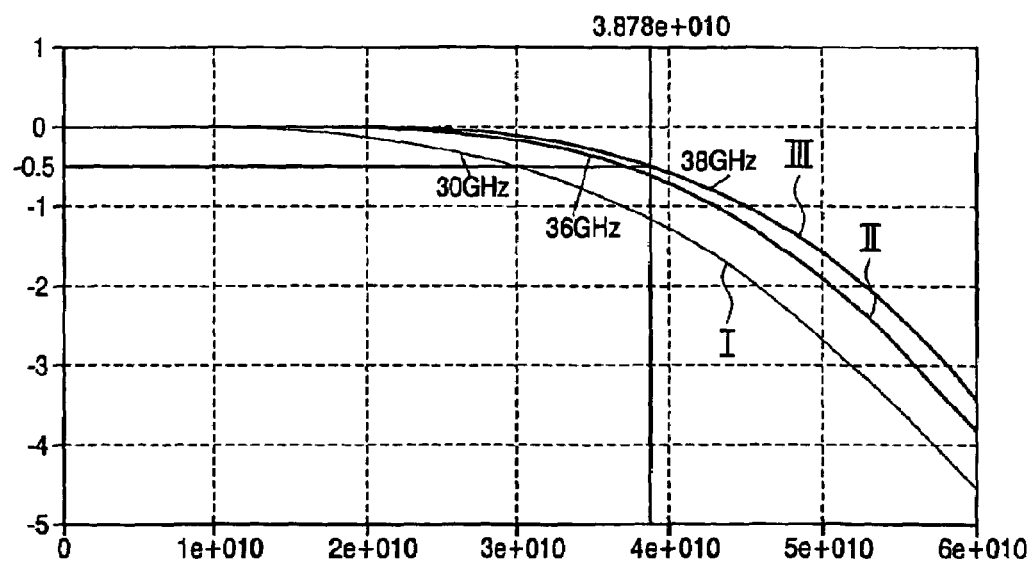
FIG. 6 shows a graph with data relating to the devices shown in FIG. 1-3.

FIG. 6 shows a graph, wherein the Insertion loss S is shown as a function of the frequency for the three transistors I, II, III. Due to the improved structure of the contact pads the insertion loss reaches its minimally required value of −0.5 dB in the transistors II,III at higher frequencies than in the transistor I.

TABLE 1

| F (GHz) | I | | II | | III | |
|---|---|---|---|---|---|---|
| | C (pF) | L (nH) | C (pF) | L (nH) | C (pF) | L (nH) |
| 10 | 0.0345 | 0.182 | 0.0357 | 0.154 | 0.0337 | 0.149 |
| 20 | 0.0343 | 0.183 | 0.0356 | 0.155 | 0.0337 | 0.150 |
| 30 | 0.0339 | 0.186 | 0.0354 | 0.156 | 0.0337 | 0.152 |
| 40 | 0.0333 | 0.189 | 0.0350 | 0.158 | 0.0336 | 0.154 |

Thus, in summary, the invention provides an electronic device comprising a semiconductor element, an encapsulation and an electrically conductive layer with a first and a second contact pad, used as signal pads, and a third contact pad used as ground pads. Due to the shape of the contact pads, the spacing is continuous, with a small entrance in between of the first and second contact pads. The device is suitable for use at frequencies below and above 30 GHz, particularly up to 40 GHz.

The invention claimed is:

1. An electronic device comprising at least one semiconductor element having a first and an opposed, second side, which at least one semiconductor element is provided with a first, a second and a third bonding pad, and which is encapsulated with a passivating material, further comprising an electrically conductive layer at the first side,
   which layer comprises a first, a second and a third contact pad suitable for external contacting, and which first, second and third contact pads are connected to the first, second and third bonding pads respectively through electrically conductive interconnecting means,
   which first and second contact pads are provided with a first and a second side face and which third contact pad is provided with a first side face,
   which first side faces of the first and second contact pads are facing the first side face of the third contact pad and are separated by a spacing that is continuous along the first side faces,
   which second side faces of the first and second contact pads are facing each other and comprise a first part and a second part, the first part located nearer to the first side face than the second part,
   which first parts of the second side faces of the first and second contact pads are at a mutual distance that is smaller than the distance between the second parts of these side faces.

2. An electronic device as claimed in claim 1, characterized in that the first and the second part of the second side faces are oriented substantially parallel to each other and are separated through a third parallel.

3. An electronic device as claimed in claim 1, characterized in that the first and second side faces of the first and the second contact pads enclose an angle which is in between of 90 and 180 degrees.

4. An electronic device as claimed in claim 1, characterized in that the spacing has a trapezium-shape.

5. An electronic device as claimed in claim 1, characterized in that the spacing is straight.

6. An electronic device as claimed in claim 1, characterized in that the third contact pad is connected to ground.

7. An electronic device as claimed in claim 1, characterized in that:
   the third contact pad is provided with a second side face opposed to the first side face;
   a fourth and a fifth contact pad are present at the second side face of the third contact pads, which are connected to fourth and fifth bonding pads at the at least one semiconductor element;
   the fourth and fifth contact pads are provided with a first and a second side face, which first side faces of the fourth and fifth contact pads are facing the second side face of the third contact pad and are separated by a spacing that is continuous, which second side faces are facing each other and comprise a first part and a second part, the first part located nearer to the first side face than the second part, which first parts of the second side faces are at a mutual distance that is smaller than the distance between the second parts of these side faces.

8. An electronic device as claimed in claim 1, characterized in that the third contact pad is connected with a second conductive layer, which is present at the second side of the semiconductor element.

9. An electronic device as claimed in claim 1, characterized in that the semiconductor element is a transistor.

10. Use of the semiconductor device of any in claim 1 at a frequency of at least 30 GHz.

* * * * *